United States Patent
Yoo et al.

(10) Patent No.: US 8,198,908 B2
(45) Date of Patent: Jun. 12, 2012

(54) PROBE SUBSTRATE WITH AUXILIARY CONTACT PADS AND PROBE CARD THEREWITH

(75) Inventors: Won Hee Yoo, Suwon-si (KR); Byeung Gyu Chang, Suwon-si (KR)

(73) Assignee: Samsung Electro-Mechanincs Co., Ltd., Suwon (KR)

( * ) Notice: Subject to any disclaimer, the term of this patent is extended or adjusted under 35 U.S.C. 154(b) by 389 days.

(21) Appl. No.: 12/461,125

(22) Filed: Jul. 31, 2009

(65) Prior Publication Data
US 2010/0283495 A1    Nov. 11, 2010

(30) Foreign Application Priority Data

May 6, 2009  (KR) .................. 10-2009-0039468

(51) Int. Cl.
    *G01R 31/00* (2006.01)
(52) U.S. Cl. ............... 324/755.01; 324/755.09
(58) Field of Classification Search ............... None
    See application file for complete search history.

(56) References Cited

U.S. PATENT DOCUMENTS

| | | | | |
|---|---|---|---|---|
| 5,600,259 | A * | 2/1997 | Bartyzel et al. | 324/750.27 |
| 7,180,315 | B2 * | 2/2007 | Tunaboylu | 324/756.03 |
| 7,649,375 | B2 * | 1/2010 | Behziz et al. | 324/763.01 |
| 7,655,103 | B2 * | 2/2010 | Chikagawa | 156/89.16 |
| 2004/0257098 | A1 * | 12/2004 | Satou et al. | 324/754 |

FOREIGN PATENT DOCUMENTS

| | | |
|---|---|---|
| JP | 57-106045 | 7/1982 |
| JP | 11-344509 | 12/1999 |
| JP | 2004-138452 | 5/2004 |
| JP | 2008-2852 | 1/2008 |
| JP | 2008-89461 | 4/2008 |
| KR | 10-0238778 | 10/1999 |
| KR | 10-2000-0046949 A | 8/2000 |
| KR | 10-2007-0117974 A | 12/2007 |
| KR | 10-2008-0091580 A | 10/2008 |

OTHER PUBLICATIONS

Korean Office Action issued May 19, 2011 in corresponding Korean Patent Application 10-2009-0039468.
Japanese Office Action issued Jul. 19, 2011 in corresponding Korean Patent Application 2009-170296.

* cited by examiner

*Primary Examiner* — Minh N Tang

(57) ABSTRACT

Disclosed are a probe substrate and a probe card using the same. The probe substrate includes a ceramic stack structure stacked with a plurality of layers; vias disposed in the ceramic stack structure to perform inner-layer connection, and pads electrically connected to the vias; a contact opening disposed at the ceramic stack structure, and partially exposing the pads; and contact pads disposed at side walls of the contact opening, electrically connected to the pads, and electrically connected to pogo pins.

9 Claims, 2 Drawing Sheets

[FIG. 1]
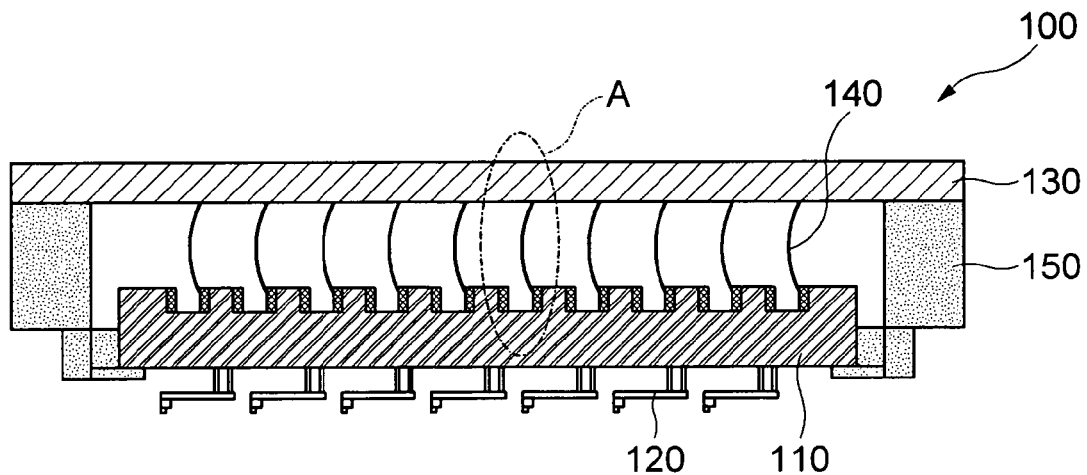
[FIG. 2]
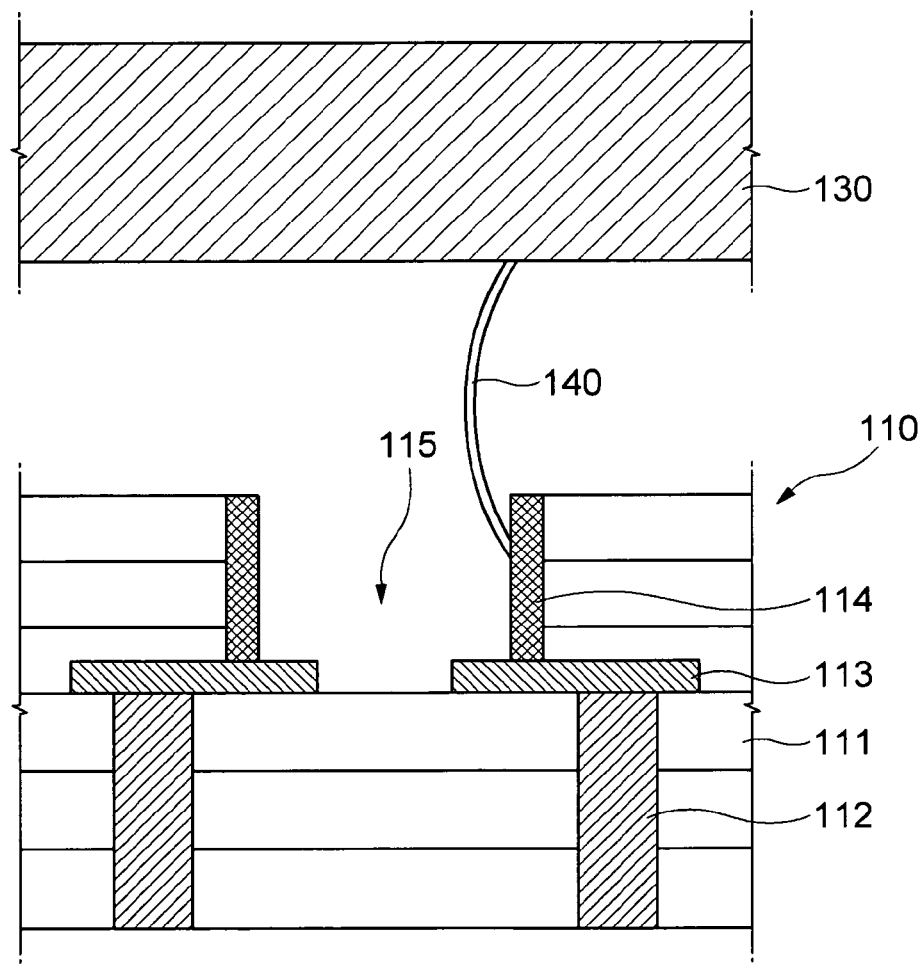

[FIG. 3]
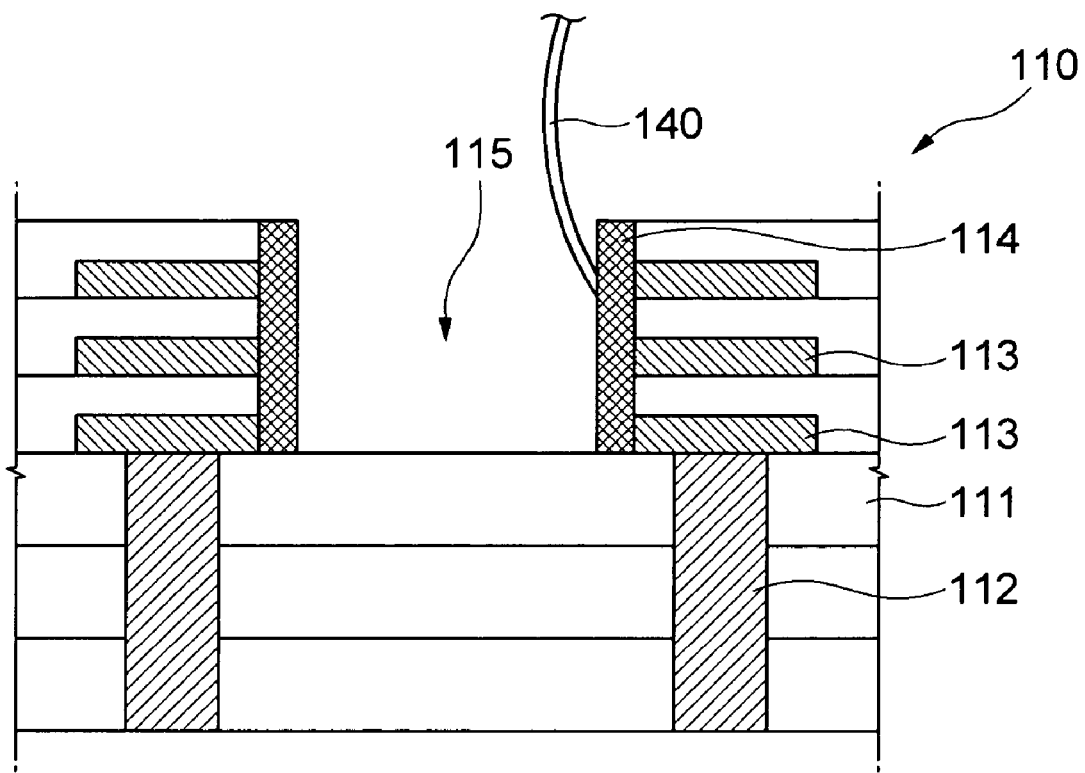
[FIG. 4]
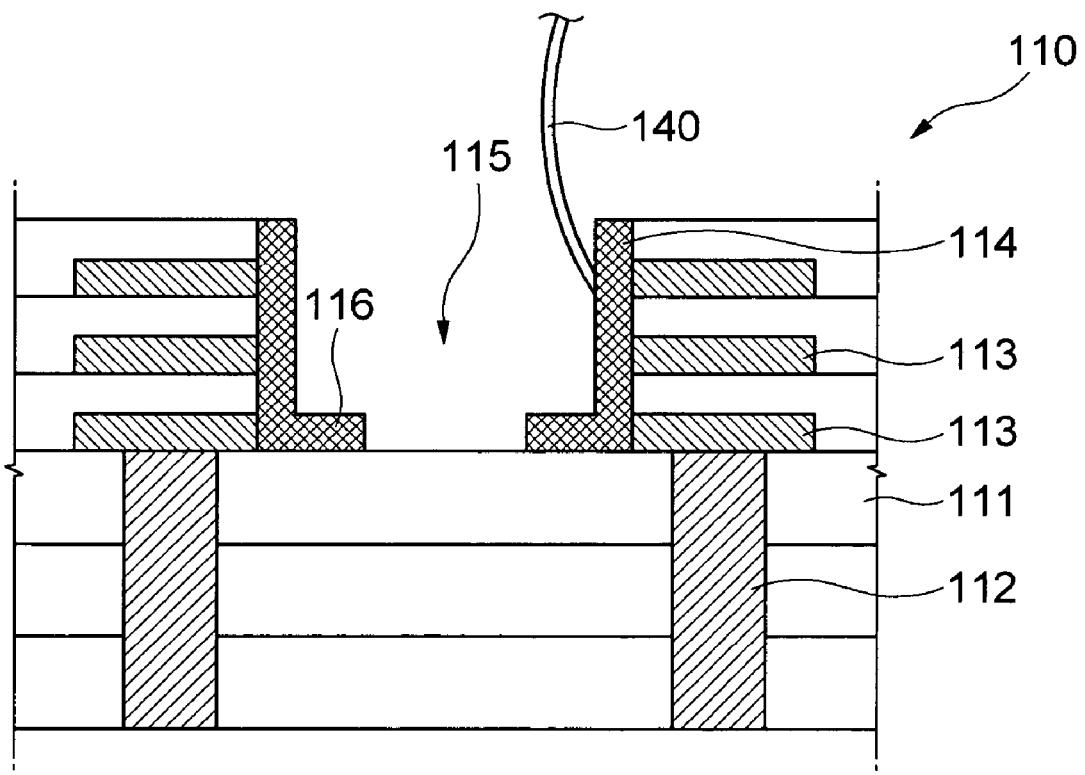

PROBE SUBSTRATE WITH AUXILIARY CONTACT PADS AND PROBE CARD THEREWITH

CROSS-REFERENCE TO RELATED APPLICATIONS

This application claims the benefit of Korean Patent Application No. 10-2009-0039468 filed with the Korea Intellectual Property Office on May 6, 2009, the disclosure of which is incorporated herein by reference.

BACKGROUND OF THE INVENTION

1. Field of the Invention

The present invention relates to a probe substrate and a probe card having the same; and, more particularly, to a probe substrate including contact openings and contact pads disposed at side walls of the contact opening to come into contact with the contact pads, and a probe card having the same.

2. Description of the Related Art

In general, processes for manufacturing semiconductor devices may include a process for forming a semiconductor wafer, a process for manufacturing semiconductor chips on a semiconductor wafer, a process for electrically examining semiconductor chips in order to confirm whether they are qualified or not, a process for packaging good-quality semiconductor chips, and a process for finally testing the packaged semiconductor chips.

Herein, in the electrical examination process, it is possible to determine whether the semiconductor chips are qualified or not, by applying electrical signals to the semiconductor chip on the wafer through an examination apparatus.

The examination apparatus may include a tester for generating electrical signals, and a probe card for transmitting test signals, which are generated from the tester, to the semiconductor chips on the wafer, or transmitting electrical signals to the tester from the semiconductor chips on the wafer.

The probe card may include probe pins used to come into electrical contact with a wafer pad, a print circuit board for receiving and transmitting electrical signals to/from the tester, and a probe substrate for electrical interconnection between the probe pins and the print circuit board.

Herein, the probe substrate and the print circuit board may use the pogo pins for signal connection. That is, the pogo pins are electrically connected to the print circuit board, and vertically comes into contact with pads disposed at an upper surface of the probe substrate.

For electrical examination of the semiconductor chips, the pogo pins are electrically connected to the probe substrate by continuously applying a force to the pads of the probe substrate. In this case, the probe substrate includes tens of thousands of pads, and the pogo pins come into contact with each of the pads, and accordingly, a large amount of force is applied to the probe substrate. Further, the examination apparatus examines a plurality of semiconductor chips, which results in deflection of the probe substrate because force applied to the probe substrate is accumulated in proportion to the number of times of semiconductor chip examination.

As such, when the flatness of the probe substrate is reduced, there may be caused electrical contact failures between the semiconductor chips and the probe pins disposed on the probe substrate. In addition, durability of the probe substrate is degraded, and thus the probe substrate must be replaced with a new one.

SUMMARY OF THE INVENTION

The present invention has been invented in order to overcome the above-described problems and it is, therefore, an object of the present invention to provide a probe substrate including contact openings and contact pads disposed at side walls of each contact opening to come into contact with the contact pads, and a probe card having the same.

In accordance with one aspect of the present invention to achieve the object, there is provided a probe substrate including: a ceramic stack structure stacked with a plurality of layers; vias disposed in the ceramic stack structure to perform inner-layer connection, and pads electrically connected to the vias; a contact opening disposed at the ceramic stack structure, and partially exposing the pads; and contact pads disposed at side walls of the contact opening, electrically connected to the pads, and electrically connected to pogo pins.

The substrate may further include auxiliary contact pads extended from the contact pads, and disposed at a portion of each of lower surfaces of the contact opening.

The ceramic stack structure may correspond to a Low Temperature Co-fired Ceramic (LTCC) stack structure or a High Temperature Co-fired Ceramic (HTCC) stack structure.

The contact pads may come into electrical contact with an upper surface of each of the pads.

The contact pads may come into electrical contact with side surfaces of the pads.

In accordance with another aspect of the present invention to achieve the object, there is provided a probe card including: a probe substrate; a print circuit board disposed on the probe substrate; and a pogo pin having one end electrically connected to the print circuit board and the other end electrically connected to the contact pad of the probe substrate, wherein the probe substrate includes: a ceramic stack structure stacked with a plurality of layers; vias disposed in the ceramic stack structure to perform inner-layer connection, and pads electrically connected to the vias; a contact opening disposed at the ceramic stack structure, and partially exposing the pads; and contact pads disposed at side walls of the contact opening, electrically connected to the pad, and electrically connected to pogo pins.

Each of the pogo pins may have a bent shape toward one surface of the contact pads.

The probe card may further include auxiliary contact pads extended from the contact pads, and disposed at a portion of each of lower surfaces of the contact opening.

The ceramic stack structure may correspond to a Low Temperature Co-fired Ceramic stack structure or a High Temperature Co-fired Ceramic stack structure.

The contact pad may come into electrical contact with an upper surface of each of the pads.

The contact pad may come into electrical contact with side surfaces of each of the pads.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a cross-sectional view of a probe card in accordance with a first embodiment of the present invention;

FIG. 2 is an expanded view of an A area shown in FIG. 1;

FIG. 3 is a cross-sectional view for explaining a probe card in accordance with a second embodiment of the present invention; and FIG. 4 is a cross-sectional view for explaining a probe card in accordance with a third embodiment of the present invention.

DETAILED DESCRIPTION OF THE PREFERABLE EMBODIMENTS

Hereinafter, embodiments of the present invention will be described in detail with reference to the accompanying drawings illustrating a probe substrate and a probe card. The following embodiments are provided as examples to allow those skilled in the art to sufficiently appreciate the spirit of the present invention. Therefore, the present invention can be implemented in other types without limiting to the following embodiments. And, for convenience, the size and the thickness of an apparatus can be overdrawn in the drawings. The same components are represented by the same reference numerals hereinafter.

FIG. 1 is a cross-sectional view of a probe card in accordance with a first embodiment of the present invention.

Referring to FIG. 1, the probe card 100 may include a probe substrate 110, probe pins 120, a print circuit board 130, and pogo pins 140.

The probe card 100 plays a role of electrically connecting an examination target to a tester (not shown) for generating electrical signals in order to perform examination of the semiconductor chips of being examination targets.

The probe substrate 110 may include a ceramic stack structure stacked with a plurality of ceramic layers indicated by reference numeral 111 of FIG. 2. Herein, the ceramic stack structure may include a Low Temperature Co-fired Ceramic (LTCC) stack structure or a High Temperature Co-fired Ceramic (HTCC) stack structure. The probe substrate 110 may have vias disposed therein to allow layers to be interconnected to one another. In addition, although not shown in the accompanying drawing, the probe substrate 110 may include a circuit layer.

Each of the probe pins 120 is fixedly installed on a lower surface of the probe substrate 110. The probe pins 120 come into electrical contact with the semiconductor chips of being examination targets, so that the semiconductor chips and the probe substrate 110 can be electrically interconnected to each other.

On an upper surface of the probe substrate 110, the contact openings 115 and the contact pads 114 formed at an inner wall thereof are disposed. That is, the contact pads 114 may be disposed on a surface vertical to the probe substrate 110. The contact pads 114 come into electrical contact with the pogo pins 140, so that the probe substrate 110 and the print circuit board 130 can be electrically interconnected to each other. Thus, the pogo pins 140 come into side contact with the probe substrate 110, so that the pogo pins 140 can come into electrical contact with the probe substrate 110 without load applied to the probe substrate 110, which results in prevention of deflection of the conventional probe substrate 110.

Herein, the pogo pins 140 may have a bent shape toward one surface of each of the contact pads 114. Thus, it is possible to improve a contact characteristic when the pogo pins 140 come into side contact with the contact pads 114 of the probe substrate 110, in comparison to a case where the pogo pins 140 have a liner shape.

The print circuit board 130 is disposed on the probe substrate 110. The print circuit board 130 may be composed of multiple circuit layers resulting from inter-layer connection of the vias. The print circuit board 130 plays a role of providing electrical signals from a tester (not shown) to the semiconductor chips of being the examination targets, or receive the electrical signals from the semiconductor chips before transmitting the electrical signals to the tester.

Further, the probe card may further include a supporting frame 150 for fixing and supporting the probe substrate 110 and the print circuit board 130.

Hereinafter, electrical contact of the probe substrate and the pogo pin will be described in detail with reference to FIG. 2.

FIG. 2 is an expanded view of an A area shown in FIG. 1

Referring to FIG. 2, the probe substrate 110 may include a plurality of ceramic layers 111. The respective ceramic layers 111 may be electrically connected to one another through vias. Also, the pads 113 electrically connected to the vias 112 may be disposed in the probe substrate 110. The pads 113 may be disposed on an upper surface of the ceramic layers 111. That is, the pads 113 may have directionality horizontal to the probe substrate 110. In addition, although not shown in the drawing, the probe substrate 110 may further have a plurality of circuit layers formed therein.

The probe substrate 110 includes a contact opening 115 partially exposing the pads 113. For example, the contact opening 115 can expose an upper surface of each of the pads 113. Herein, the ceramic layers 111 may be disposed on the pads 113, and the contact opening 115 may be formed by removing a portion of a plurality of ceramic layers 111. In the embodiment of the present invention, the number of the ceramic layers 111 covered by the pads 113 is three. However, the present invention is not limited thereto.

The contact pads 114 electrically connected to the pads 113 are disposed at an inner wall of the contact opening 115. Herein, the contact pads 114 may be formed to have a constant slope with respect to the pads 113. For example, as shown in the drawing, the contact pads 114 may have directionality vertical to the probe substrate 110. However, the embodiment of the present invention is not limited to this, and the contact pads 114 may have a constant slop with respect to the probe substrate 110 so that the pogo pins 140 can come into side contact with the contact pads 114.

The contact pads 114 may be formed by forming a seed layer at an inner wall of the contact opening 115, and then using the plating method through the formed seed layer. Herein, the seed layer may be formed by using a printing method. Thus, the contact pads 114 may include the seed layer and the plated layer disposed on the seed layer.

The contact pads 114 are disposed at the inner wall of the contact opening 115, so that the contact pads 114 can come into electrical contact with the pogo pins 140 through the side contact. Accordingly, the pogo pins 140 can come into electrical contact with the probe substrate 110 without vertical load, and thus the pogo pins 140 can come into electrical contact with the probe substrate 110, which results in prevention of deflection of the probe substrate 110.

Therefore, in the embodiment of the present invention, the probe substrate is electrically connected to the pogo pins through the side contact, and thus it is possible to prevent deflection of the probe substrate, which results in prevention of degradation of durability and reliability of the probe substrate.

Hereinafter, a probe card in accordance with a second embodiment of the present invention will be described with reference to FIG. 3. The probe card of the second embodiment of the present invention has the same construction as that described above, except for the contact pads, and thus overlapping description thereof will be omitted.

FIG. 3 is a cross-sectional view for explaining a probe card in accordance with a second embodiment of the present invention.

Referring to FIG. 3, the probe card may include a ceramic stack structure, and the vias 112, the pads 113, the contact pads 114, and the contact opening 115. The ceramic stack structure is stacked with a plurality of layers, and the vias 112 are disposed in the ceramic stack structure to allow layers to be interconnected to one another. The pads 113 are electrically connected to the vias 112. The contact pads 114 are disposed at the side walls of the contact opening 115, are electrically connected to the pads 113, and are electrically connected to the pogo pins 140. The contact opening 115 partially exposes the pads 113, and is disposed at the ceramic stack structure.

The contact opening 115 may expose a side surface of the pads 113. Herein, the pads 113 may be disposed on each of the ceramic layers 111 at the side walls of the contact opening 115, in order to use the pads 113 as the seed layer for forming the contact pads 114.

The contact pads 114 are formed at the side walls of the contact opening 115, so that the contact pads 114 can be electrically connected to the side walls of the pads 113. Also, the contact pads 114 may be formed through electroless plating method using the pads 113 as a seed layer. That is, the contact pads 114 may include the plated layers.

Therefore, in the embodiment of the present invention, in order that the contact pads come into side contact with the pogo pins, the contact pads are formed at the inner wall of the contact opening. Further, the contact opening is formed to expose the side surfaces of the pads, so that it is possible to form the contact pads through electroless plating using the pads without forming a separate seed layer. Therefore, it is possible to more simplify processes.

Hereinafter, a probe card in accordance with a third embodiment of the present invention will be described with reference to FIG. 4. The probe card of the second embodiment of the present invention has the same construction as that described above, except for the auxiliary contact pads, and thus overlapping description thereof will be omitted.

FIG. 4 is a cross-sectional view for explaining a probe card in accordance with the third embodiment of the present invention.

Referring to FIG. 4, the probe card may include a ceramic stack structure, the vias 112, the pads 113, the contact opening 115, and the contact pads 114. The ceramic stack structure is composed of the ceramic layers 111 stacked with a plurality of layers, and the vias 112 are disposed in the ceramic stack structure to perform inter-layer connection. The pads 113 are electrically connected to the vias 112, and the contact opening 115 partially exposes the pads 113, and is disposed at the ceramic stack structure. The contact pads 114 are disposed at the side walls of the contact opening 115, are electrically connected to the pads 113, and are electrically connected to the pogo pins 140.

The contact opening 115 may be formed to expose the side surfaces of the pads 113. Herein, the contact pads 114 are formed at the side walls of the contact opening 115, so that the contact pads 114 can be electrically connected to the side surfaces of the pads 113.

When the contact pads 114 come into side contact with the pogo pins 140, excessive load is applied to the pogo pins 140. Therefore, the pogo pins 140 may come into contact with a lower surface of the contact opening 115 along the contact pads 114, resulting in a poor contact between the contact pads 114 and the pogo pins 140.

In order to solve this problem, the probe substrate 110 may be electrically connected to the contact pads 114, and the probe substrate 110 may further include auxiliary contact pads 116 disposed at a portion of the lower surface of the contact opening 115. The auxiliary contact pads 116 may be extended from one end of contact pads 114. That is, the auxiliary contact pads 116 may be integrated with the contact pads 114.

In the embodiment of the present invention, the contact pads 114 come into electrical contact with the side surface of the pads 113. However, the present invention is not limited to this, and the contact pads 114 may be electrically contacted with the upper surface of the pads 113.

Therefore, in the embodiment of the present invention, it is possible to prevent a poor contact between the pogo pins and the contact pads by forming the auxiliary contact pads at a portion of the lower surface of the contact opening.

The probe substrate in accordance with the present invention can prevent deflection of the probe substrate caused by load of the pogo pins.

Further, the probe substrate of the present invention can solve a problem such as deflection of the probe substrate, so that it is possible to prevent degradation of durability and reliability of the probe substrate.

Further, the present invention is capable of improving the contact failures of the pogo pins by forming the probe substrate of the present invention to be extended to portions of each lower surface of the contact opening as well as side walls of the contact opening.

As described above, although the preferable embodiments of the present invention have been shown and described, it will be appreciated by those skilled in the art that substitutions, modifications and changes may be made in this embodiment without departing from the principles and spirit of the general inventive concept, the scope of which is defined in the appended claims and their equivalents.

What is claimed is:

1. A probe substrate comprising:
   a ceramic stack structure stacked with a plurality of layers;
   vias disposed in the ceramic stack structure to perform inner-layer connection, and pads electrically connected to the vias;
   a contact opening disposed at the ceramic stack structure, and partially exposing the pads;
   contact pads disposed at side walls of the contact opening, electrically connected to the pads, and electrically connected to pogo pins; and
   auxiliary contact pads extending from the contact pads, and disposed at a portion of each of lower surfaces of the contact opening.

2. The probe substrate of claim 1, wherein the ceramic stack structure corresponds to a Low Temperature Co-fired Ceramic (LTCC) stack structure or a High Temperature Co-fired Ceramic (HTCC) stack structure.

3. The probe substrate of claim 1, wherein the contact pads come into electrical contact with an upper surface of each of the pads.

4. The probe substrate of claim 1, wherein the contact pads come into electrical contact with side surfaces of the pads.

5. A probe card comprising:
   a probe substrate;
   a print circuit board disposed on the probe substrate; and
   pogo pins having one end electrically connected to the print circuit board and the other end electrically connected to the probe substrate, wherein the probe substrate comprises:

a ceramic stack structure stacked with a plurality of layers;

vias disposed in the ceramic stack structure to perform inner-layer connection, and pads electrically connected to the vias;

a contact opening disposed at the ceramic stack structure, and partially exposing the pads;

contact pads disposed at side walls of the contact opening, electrically connected to the pads, and electrically connected to the pogo pins; and auxiliary contact pads extending from the contact pads, and disposed at a portion of each of lower surfaces of the contact opening.

6. The probe card of claim 5, wherein each of the pogo pins has a bent shape toward one surface of the contact pads.

7. The probe card of claim 5, wherein the ceramic stack structure corresponds to a Low Temperature Co-fired Ceramic stack structure or a High Temperature Co-fired Ceramic stack structure.

8. The probe card of claim 5, wherein the contact pads come into electrical contact with an upper surface of each of the pads.

9. The probe card of claim 5, wherein the contact pads come into electrical contact with side surfaces of each of the pads.

* * * * *

UNITED STATES PATENT AND TRADEMARK OFFICE
CERTIFICATE OF CORRECTION

PATENT NO. : 8,198,908 B2  Page 1 of 1
APPLICATION NO. : 12/461125
DATED : June 12, 2012
INVENTOR(S) : Won Hee Yoo et al.

It is certified that error appears in the above-identified patent and that said Letters Patent is hereby corrected as shown below:

On the Title Page, Item (73) (Assignee), Line 1, Delete "Electro-Mechanincs" and insert
-- Electro-Mechanics --, therefor.

Signed and Sealed this
Twenty-eighth Day of August, 2012

David J. Kappos
*Director of the United States Patent and Trademark Office*